(12) United States Patent
Kent et al.

(10) Patent No.: US 7,281,324 B2
(45) Date of Patent: Oct. 16, 2007

(54) METHOD OF SIMULTANEOUSLY FABRICATING CIRCUIT BLOCKS

(75) Inventors: Harold B. Kent, Portola Valley, CA (US); James J. LeVante, Redwood City, CA (US); Joseph R. Layton, Sunnyvale, CA (US); Aaron T. Fine, Alviso, CA (US)

(73) Assignee: Medconx, Inc., Santa Clara, CA (US)

( * ) Notice: Subject to any disclaimer, the term of this patent is extended or adjusted under 35 U.S.C. 154(b) by 0 days.

(21) Appl. No.: 11/104,634

(22) Filed: Apr. 11, 2005

(65) Prior Publication Data

US 2006/0016069 A1    Jan. 26, 2006

Related U.S. Application Data

(62) Division of application No. 10/897,616, filed on Jul. 23, 2004.

(51) Int. Cl.
*H05K 3/02* (2006.01)
*H05K 3/10* (2006.01)

(52) U.S. Cl. ............... 29/846; 29/831; 29/874; 29/884; 174/50.52; 174/250; 439/76.1

(58) Field of Classification Search .......... 29/411–415, 29/417, 425, 830–832, 874, 846, 884; 174/50.52, 174/250, 260, 262; 361/760, 763; 439/76.1, 439/733.1
See application file for complete search history.

(56) References Cited

U.S. PATENT DOCUMENTS

| | | | | |
|---|---|---|---|---|
| 3,780,431 A | * | 12/1973 | Feeney | .................. 29/830 |
| 4,070,080 A | * | 1/1978 | Eshleman et al. | .......... 439/345 |
| 4,183,137 A | * | 1/1980 | Lomerson | .................. 29/853 |
| 4,820,204 A | | 4/1989 | Batty et al. | |
| 4,852,227 A | * | 8/1989 | Burks | ...................... 29/414 |
| 5,572,779 A | * | 11/1996 | Adelman et al. | .............. 29/412 |
| 6,010,348 A | | 1/2000 | Alden | |
| 6,121,678 A | * | 9/2000 | Chiu et al. | .................. 361/736 |
| 6,413,119 B1 | * | 7/2002 | Gabrisko et al. | ........... 439/620 |
| 2003/0014864 A1 | * | 1/2003 | Gazelot et al. | ............... 29/852 |
| 2003/0233087 A1 | | 12/2003 | Chen | |

FOREIGN PATENT DOCUMENTS

WO    WO2004/075349    9/2004

* cited by examiner

*Primary Examiner*—Minh Trinh
*Assistant Examiner*—Donghai D. Nguyen
(74) *Attorney, Agent, or Firm*—Jones Day

(57) ABSTRACT

A method of simultaneously fabricating a plurality of circuit blocks is presented. Each circuit block is configured for aligned positioning onto a housing of an individual electrical connector. The method includes simultaneously fabricating a plurality of circuits on a single sheet of material and cutting a repeating pattern of holes across the sheet of material. Then the sheet is separated into individual identical sections that have one or more peripheral edge. A circuit board is defined by each section. Each of the sections has a peripheral shape that is defined by the one or more peripheral edges. The peripheral shape is sized and configured to be receivable in only one orientation into a housing of an electrical connector. The holes are cut in the sheet of material such that holes are associated with each peripheral edge of each section.

28 Claims, 17 Drawing Sheets

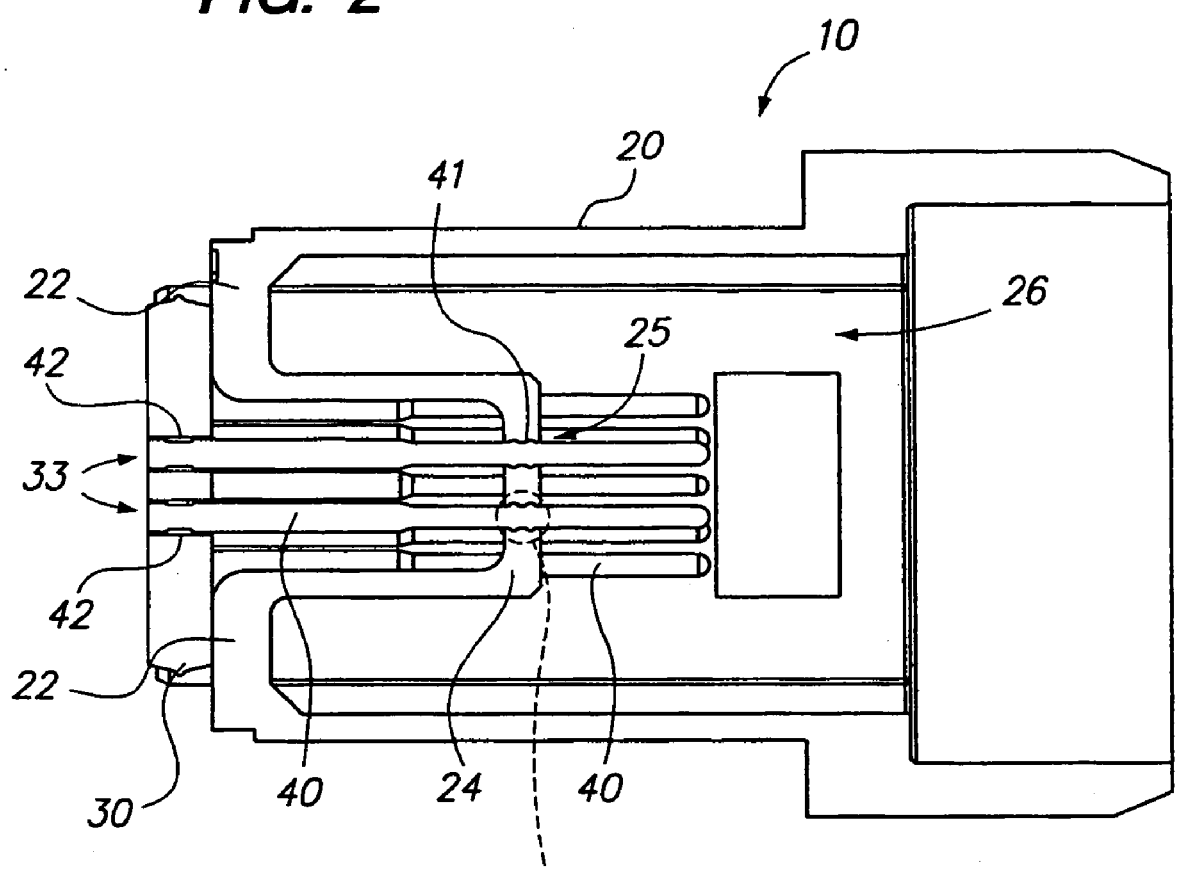

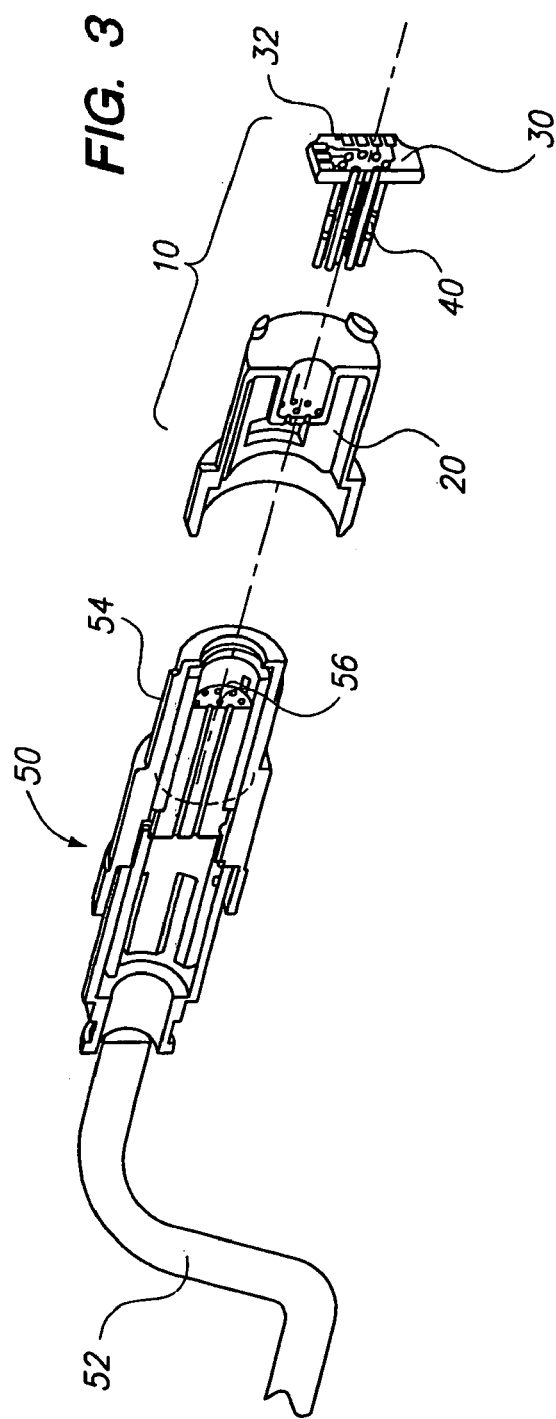
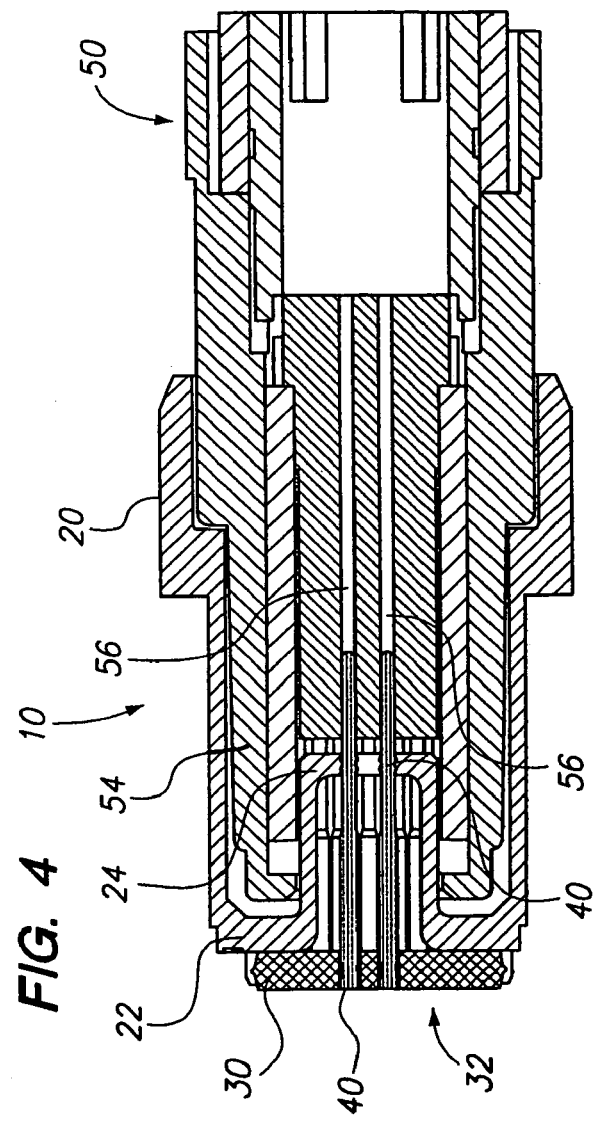

FIG. 6A
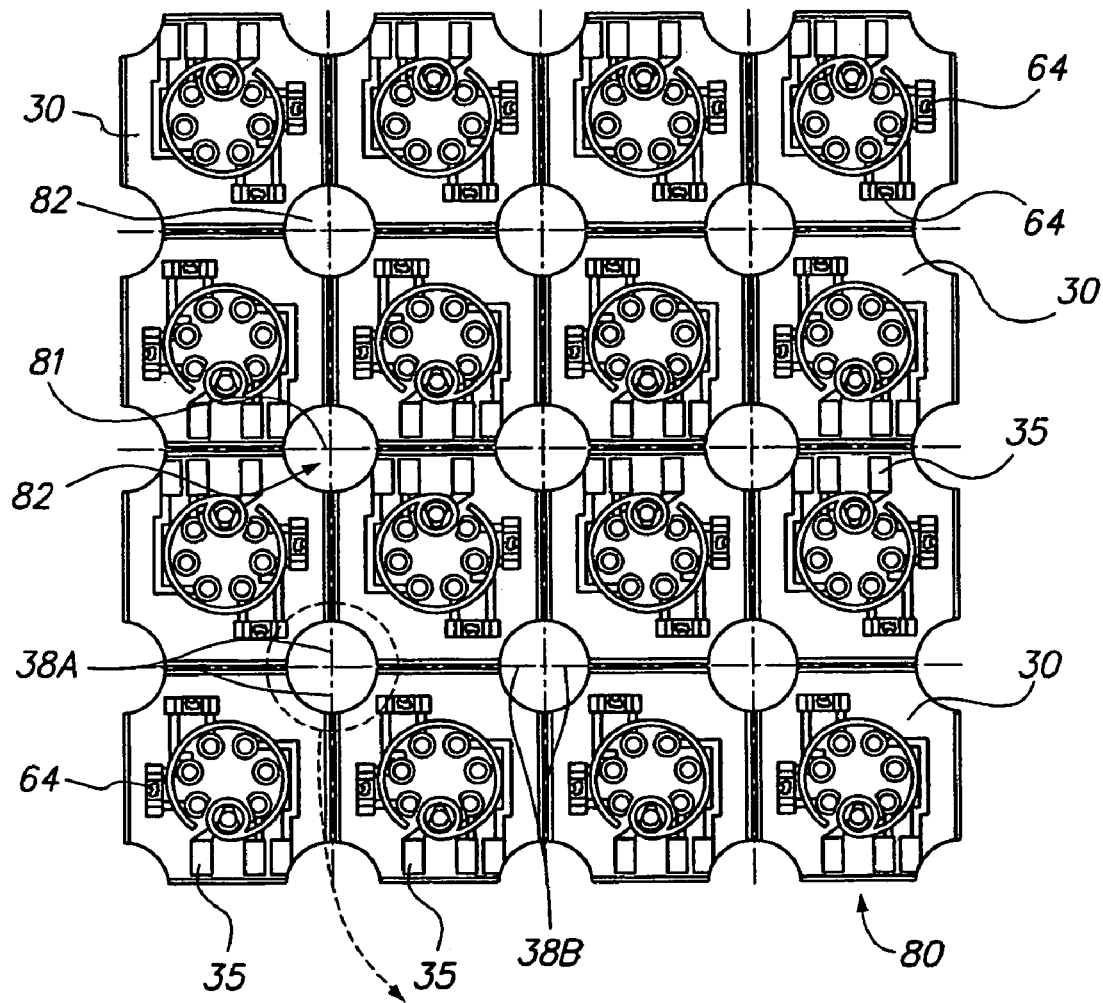
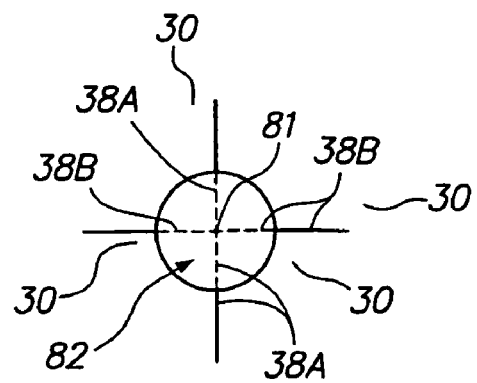

FIG. 6B
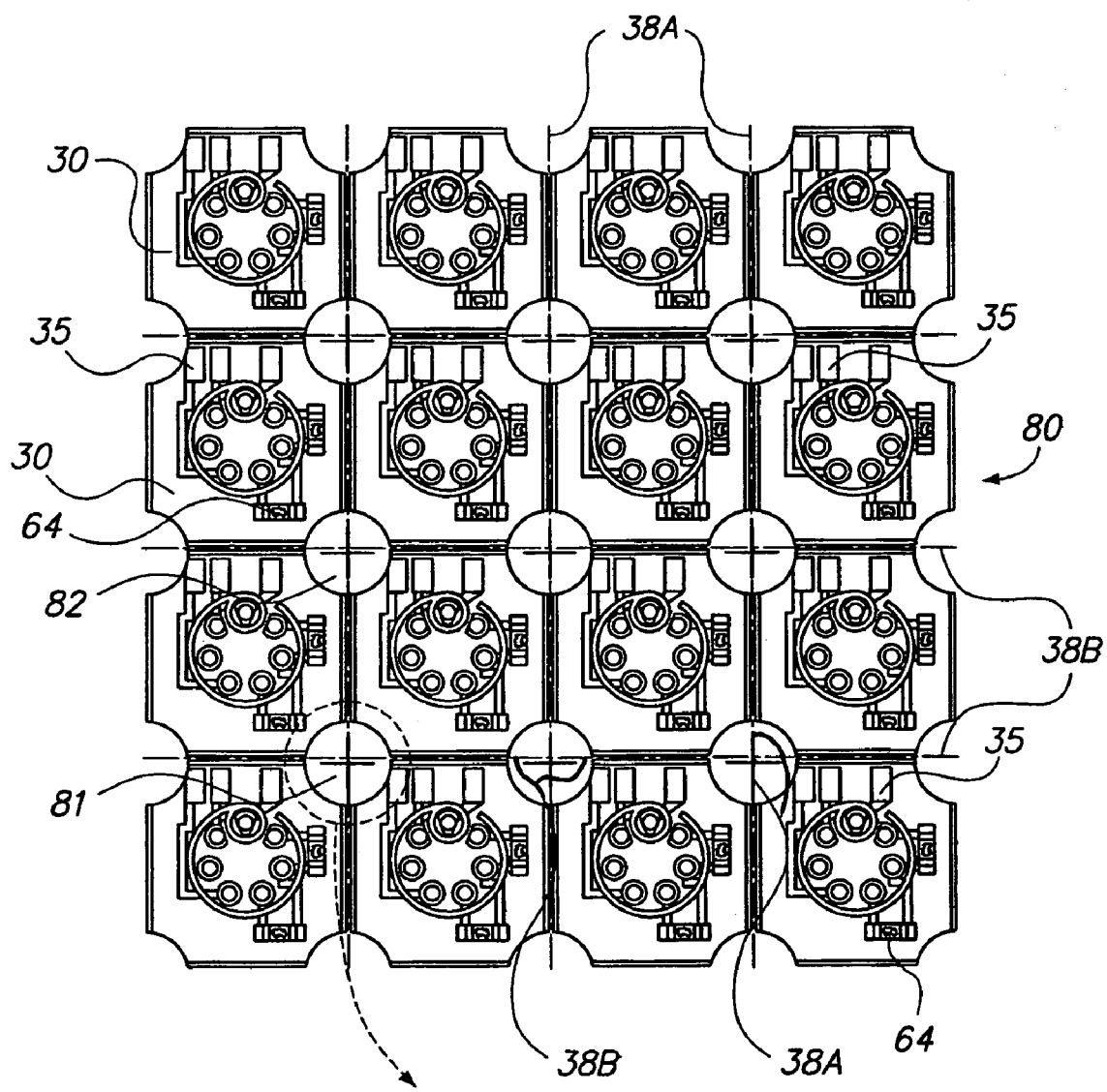
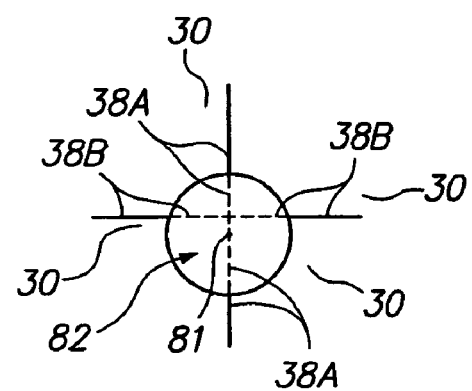

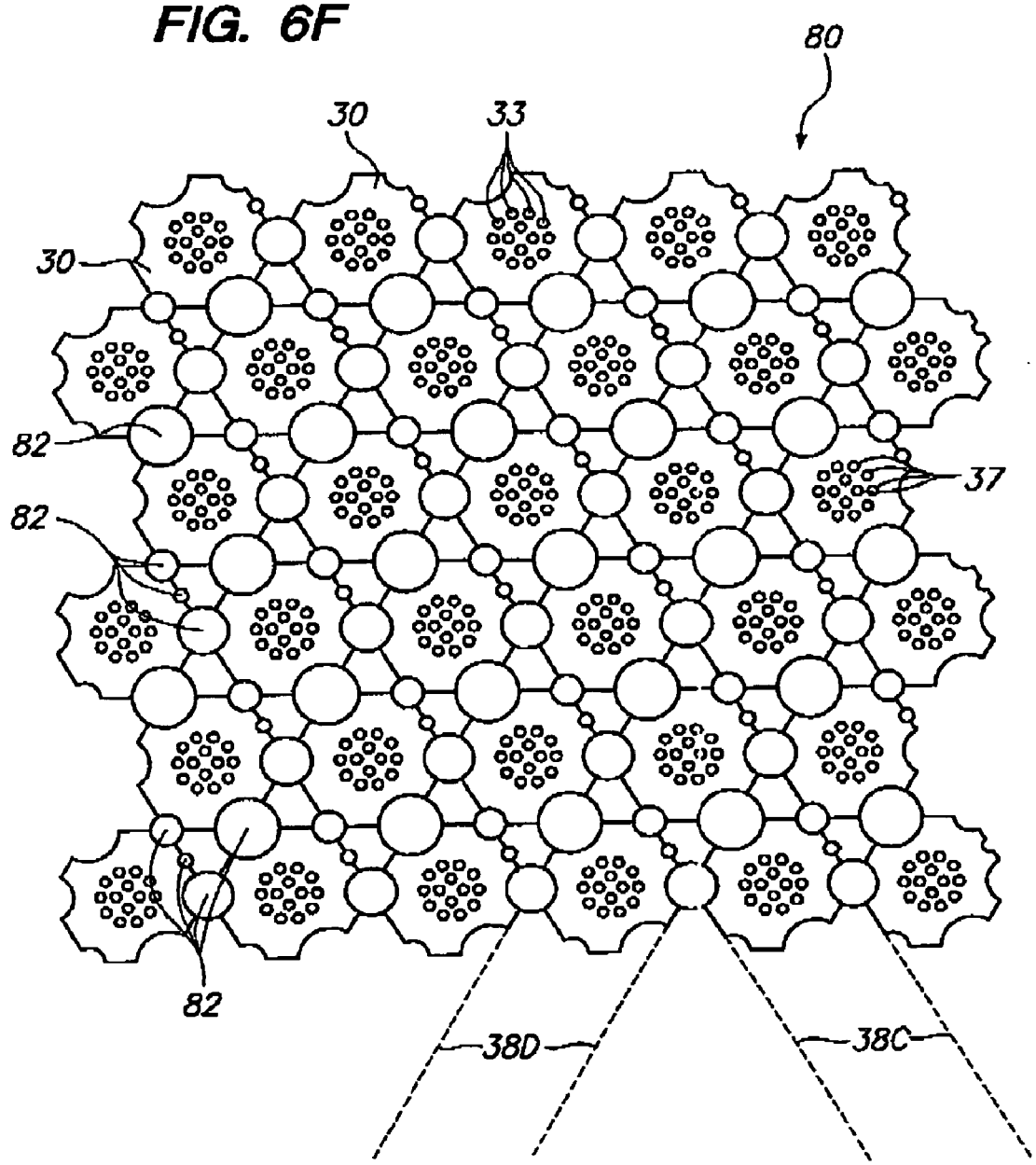

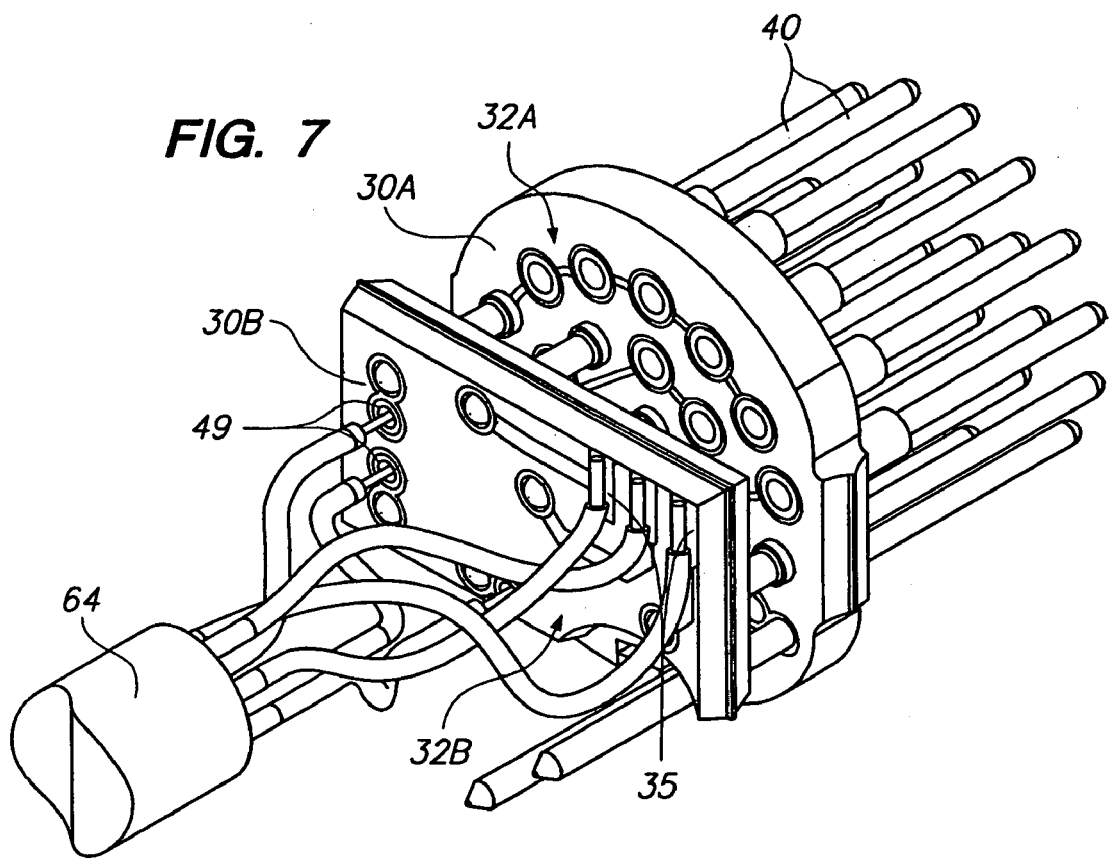

METHOD OF SIMULTANEOUSLY FABRICATING CIRCUIT BLOCKS

RELATED APPLICATION

The present application is a divisional of U.S. patent application Ser. No. 10/897,616 filed Jul. 23, 2004, the entire contents of which are incorporated herein by reference.

TECHNICAL FIELD

The present invention relates in general to connector systems and in particular to electrical connectors used for plugging electrical cables into electrical devices. In one particular embodiment, the present invention provides an intelligent circuit metal contact pin connector system for plugging together an electrical cable and a standard electrical device.

BACKGROUND OF THE INVENTION

Electrical and electronic devices are often connected to cables through "metal pin" connector systems in which the electrical device is fabricated with a connector housing having a plurality of metal contact pins therein. These metal contact pins are received into corresponding pin receptacles in the device when the cable is plugged into the electrical device.

An example of such a "metal pin" plug connector system is described in Prior Art FIGS. 10 to 12 of commonly assigned Published U.S. Patent Application US2003/0233087, in which such connector system is illustrated in the context of a disposable surgical device A first disadvantage of the prior art system of FIGS. 10 to 12 of Published U.S. Patent Application US2003/0233087 is that it is expensive and time consuming to fabricate. This is due to the fact that the metal contact pins in the connector assembly often must be assembled one-by-one into a housing (or shell) within the electrical device. Then, they are often individually electrically connected to various components within the body of the electrical device. In addition, the metal contact pins must be assembled into the housing in a preferred geometry such that they mate with corresponding pin receiving receptacles in the plug end of a cable.

Such preferred pin geometry will vary depending upon the nature of the electrical device itself. Different electrical devices will have different contact pin geometries. This is especially true in the case of medical devices where there is little standardization in "metal pin" connector systems. Moreover, medical devices tend to be "limited run" production assemblies in which a relatively small number of medical devices are made. Since each of the medical devices tend to have their own particular pin geometries, it has proven very difficult to standardize the assembly of their connectors.

Thus, it is time consuming and very expensive both to assemble the individual metal contact pins in a preferred geometry, and to connect the metal contact pins to particular electronic components in the device.

A second disadvantage of existing "metal pin" plug connector systems is that such metal contact pins are delicate structures that may easily become bent, especially after the device has been plugged and un-plugged numerous times.

A third disadvantage is that the metal contact pins (and the electronic components connected thereto) may become contaminated by fluids, such as bodily fluids in the case of medical devices.

What is instead desired is a connector assembly that incorporates an intelligent circuit thereon. Such a system would have the advantage of providing a connector that can easily be configured to be installed into a variety of different electrical systems (e.g.: into different housings in different plug-in connector interfaces). Having such an intelligent circuit directly incorporated into the connector assembly itself would also avoid the problem of having to connect the metal contact pins to a variety of different electrical components positioned at different locations within the electrical device. For example, the need to connect the metal contact pins to a separate intelligent circuit located away from the connector assembly would be avoided. (e.g.: see circuit board 35 in FIG. 12 of Published US Patent Application US2003/0233087).

It is also desirable that such an intelligent circuit be fabricated in away such that it can be assembled easily and quickly into the connector assembly, thereby facilitating inexpensive large volume production of such connector assemblies.

What is also desired is a connector assembly that can be assembled easily and economically. It is especially desirable that such connector assembly be easily and economically assembled using different contact pin geometries, as desired. It is also desirable that such connector assembly be easily configured for operation with different electrical devices.

What is also desired is a connector assembly that provides structural rigidity for the metal contact pins such that they a not likely to bend or break after repeated uses.

It is also desirable that the connector assembly be fluid resistant.

Finally, the connector should be able to withstand common sterilization techniques.

SUMMARY OF THE INVENTION

The present invention provides an intelligent connector assembly for connecting a device to a cable (or for connecting different devices together). The present invention provides an improvement over existing "metal pin" plug-type connector systems by incorporating an intelligent circuit directly into the housing surrounding the metal contact pins. The intelligent circuit is disposed on a block of material that is specifically fabricated such that it can be quickly and easily mounted into or onto the housing during assembly.

In a preferred embodiment, the present invention provides an intelligent connector assembly for use in an interface between an electrical device and a cable, comprising: a housing; a block or blocks having a circuit thereon, the block being configured to be received onto the housing; alignment features on the housing and the block such that the block is receivable in only one orientation into the housing; and a plurality of electrical contacts on the block. (In optional embodiments, the block does not have a circuit thereon).

In various embodiments, the block of material maybe a printed circuit board, or a piece of plastic, or ceramic, or any other material that can contain a circuit. Moreover, the electrical contacts on the block may be metal contact pins, but need not be so. They need not even be made of metal. Moreover, they may be replaced by other electrical contacts such as wire receiving clips.

In preferred embodiments, the alignment features on the housing maybe a recess or a plurality of external bosses dimensioned to receive the block therein. The alignment feature on the block may be the shape of the block itself. For example, one or more of the corners may be removed from a generally rectangular block such that it fits into the housing in only one orientation.

In preferred embodiments, the metal contact pins may be supported at various positions along their length by an inner wall of the housing to resist bending. Optionally, the inner wall of the housing is continuous with an outer wall of the housing to which the circuit block is attached, thereby providing a fluidic seal within the connector.

The present invention also provides systems for fabricating the intelligent circuit blocks themselves such that a plurality of circuit blocks can be made simultaneously, with each block being specifically shaped for receipt into the housing of an individual connector assembly in only one orientation.

In a preferred embodiment, the present invention provides a method of simultaneously fabricating a plurality of circuit blocks, wherein each circuit block is configured for aligned positioning onto a housing of an individual electrical connector, comprising: simultaneously fabricating a plurality of circuit blocks on a single sheet of material; cutting a repeating pattern of holes across the single sheet; and separating the single sheet into sections such that each individual block is disposed on an identically shaped section of the single sheet, wherein each of the identically shaped sections of the single sheet are shaped to be receivable in only one orientation into the housing of an electrical connector.

An advantage of the present invention is that it provides a connector assembly having a logic circuit embedded thereon, thus greatly facilitating electrical assembly and inter-compatibility of the device.

A second advantage of the present invention is that the electrical circuits that are incorporated into such devices can be fabricated simultaneously in high volume, and with only a minimum amount of material wastage. Thus, the present invention is able to cheaply and easily mount passive and/or active components onto each circuit, as well as providing ground planes, EMI, and RFI shielding.

A third advantage of the present invention is that it can be assembled easily and economically.

A fourth advantage of the present invention is that it provides very precise two dimensional and three dimensional alignment and structural support for its electrical contacts (which may be metal contact pins).

A fifth advantage of the present invention is that the method of alignment and retention can induce a seal between the connector and the contact pins. This seal will prevent fluids and gasses from moving beyond the inner wall of the connector.

BRIEF DESCRIPTION OF THE DRAWINGS

FIG. 2 is a cross sectional side view corresponding to FIG. 1B.

FIG. 3 is an exploded sectional perspective view of the end of a cable positioned to be plugged into the connector assembly of FIG. 1.

FIG. 4 is a sectional side elevation view corresponding to FIG. 3, showing the electrical cable and the connector assembly plugged together.

(FIGS. 5A to 5D, 5F and 5G are end views, and FIG. 5F is a rear perspective view).

FIGS. 6A to 6F are top plan views of a plurality of individual circuit blocks formed from a single sheet of material, wherein:

FIG. 6A shows a repeating pattern of equal sized holes centered at the intersections of adjacent circuit blocks;

FIG. 6B shows a repeating pattern of equal sized holes having centers offset in one direction from the intersections of adjacent circuit blocks;

FIG. 6C shows a repeating pattern of equal sized holes having centers offset in two directions from the intersections of adjacent circuit blocks;

FIG. 6D shows a repeating pattern of two different sized holes;

FIG. 6E shows a repeating pattern of holes (using fewer holes than the embodiment shown in FIG. 6A); and FIG. 6F shows a repeating pattern of holes with individual circuit blocks formed in a hexagonal shape.

FIG. 7 is a perspective view of an embodiment of the invention in which a second circuit block is received on top of the first circuit block.

DETAILED DESCRIPTION OF THE DRAWINGS

The present invention provides an intelligent connector interface that can be used to connect an electrical device and a cable together. It can, however, also be used to connect two devices together.

Figure 1A:
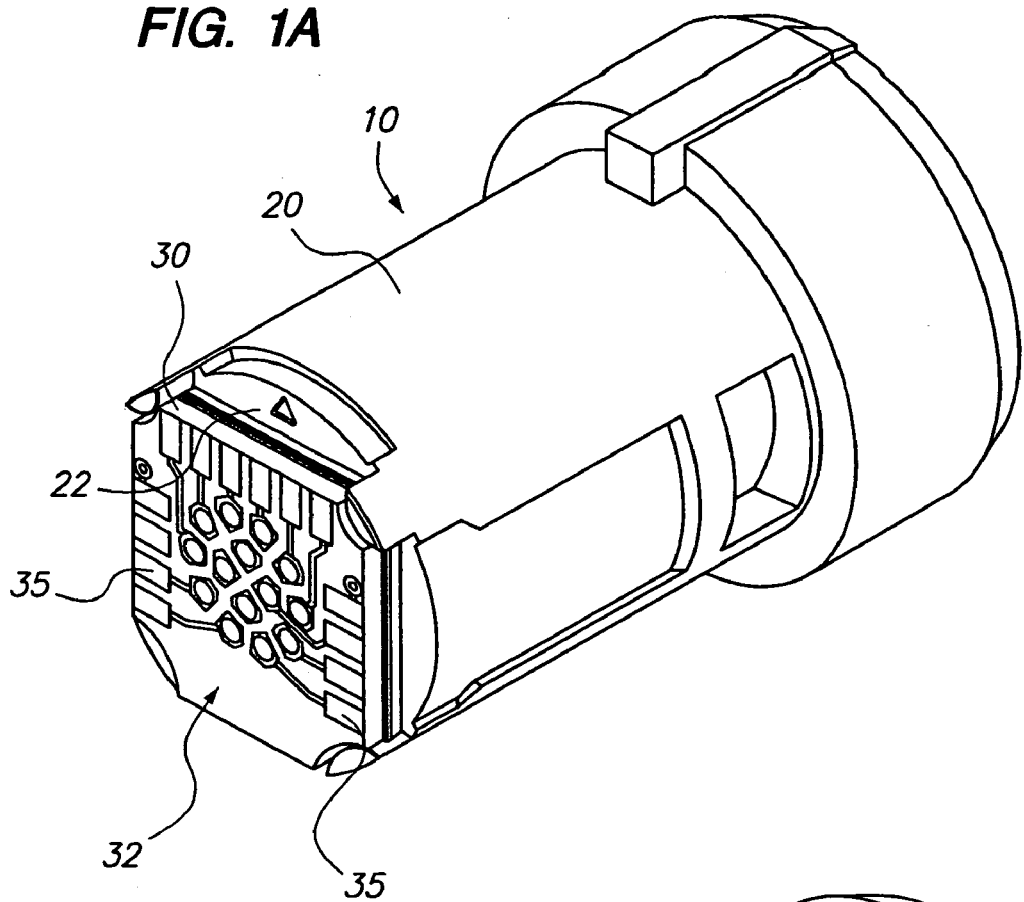
FIG. 1A is a side perspective view of the intelligent connector assembly of the present invention.
Figure 1B:
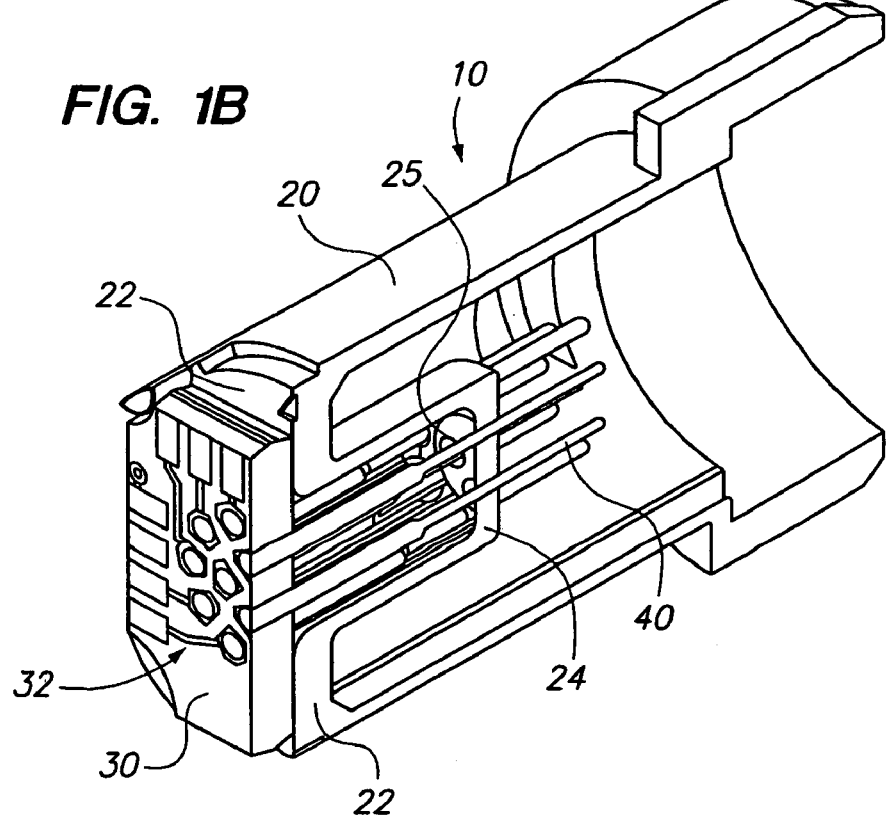
FIG. 1B is a sectional view corresponding to FIG. 1A.

Referring first to FIGS. 1A to 2, the present connector assembly 10 includes a housing 20, a circuit block 30, and a plurality of electrical contacts (e.g.: contact pins 40, which may be made of metal).

Housing 20 and circuit block 30 have alignment features thereon such that circuit block 30 is receivable into (or onto) housing 20 in only one orientation. Housing 20 may be made of plastic, but is not limited to any particular material. In those embodiments where housing 20 is plastic, it may be injection molded.

Circuit block 30 is a block of material having a circuit 32 formed thereon. Circuit block 30 may be made from a printed circuit board, but is not so limited. Rather, circuit block 30 may be made from any other suitable material onto which a circuit may be fabricated, including plastic.

As can be seen, housing 20, circuit block 30 and contact pins 40 fit together to provide a stable, aligned connector assembly 10. As can be seen, housing 20 includes an outer wall 22 and an inner wall 24. Circuit block 30 is received onto outer wall 22 of housing 20. Contact pins 40 (which are preferably metal) extend both though circuit block 30 and through inner wall 24. As such, contact pins 40 are supported at a point along their length (i.e.: by inner wall 24). Inner wall 24 thus provides support for pins 40, reducing their cantilever length, thus making them less likely to bend. In addition, holes 25 in inner wall 24 also provide alignment for pins 40. In optional embodiments, pins 40 have barbs 41 that are received into holes 25. Barbs 41 provide a tight attachment between pins 40 and inner wall 24. As a result, a fluidic seal may be created across inner wall 24, such that any fluid contamination present in open plug receiving portion 26 of housing does not reach circuit block 30.

As can also be seen, contact pins 40 preferably pass through circuit block 30. For example, contact pins 40 may be inserted through holes 33 in circuit block 30 during assembly of the device. Thus, contact pins 40 assist in holding circuit block 30 onto housing 20, while holes 33 in circuit block 30 assist in aligning contact pins 40. Optionally, contact pins 40 may have barbs 42 which assist in holding contact pins 40 and circuit block 30 together.

As will also be shown, alignment features on each of housing 20 and circuit block 30 ensure that circuit block 30 can only be received into one orientation in housing 20.

As a result of the unique way in which housing 20, circuit block 30 and contact pins 40 fit together, a connector assembly 10 having enhanced stability is provided. Specifically, circuit block 30 is fixed in position relative to housing 20, with contact pins 40 assisting in holding circuit block 30 onto outer wall 22 of housing 20, and with inner wall 24 assisting in holding contact pins 40 in an aligned position.

Referring next to FIG. 3, an industry standard connector interface 50 at the end of an electrical cable 52 (such as a power cable) is provided. Plug end 54 has a plurality of contact holes 56 into which contact pins 40 are received. Various electrical components may be attached to circuit 32, thus electrically communicating with contact pins 40. For example, a flex circuit (not shown) may be attached to circuit 32.

FIG. 4 illustrates connector interface 50 and connector assembly 10 plugged together with contact pins 40 received into contact holes 56. In optional embodiments, connector interface 50 is in electrical communication with a medical device (not shown). In one preferred embodiment, housing 20 may thus be a plug-in receptacle within a medical device. It is to be understood, however, that the present invention is not so limited. For example, connector interface 50 and connector assembly 10 may be connected to any electrical device.

Contact pins 40 are in electrical communication with circuit 32 on circuit block 30. As a result, when pins 40 are received into a plug end 54 of a power or other cable 52 (shown in FIG. 3) various electrical components within the device (in which housing 20 is disposed) would then be in electrical communication with cable 52.

In various embodiments of the invention, one or more of contact pins 40 may be substituted by wire receiving clips 49 mounted into circuit block 30 (See FIG. 7). Thus, circuit block 30 may be adapted for easy interconnection to various electrical components, including the direct receipt of wire ends or other contact pins 40 therein.

As stated above, circuit block 30 and housing 20 are formed such that circuit block 30 may only be received into (or onto) housing 20 in one orientation.

As shown in FIGS. 5A to 5D, 5F and 5G, the alignment feature on housing 20 may simply be a recess 21 dimensioned to receive circuit block 30 therein. Alternately, as shown in FIG. 5E, the alignment feature on housing 20 may be a plurality of external bosses 27 extending from housing 20 dimensioned to receive circuit block 30 therebetween.

Figure 5A:
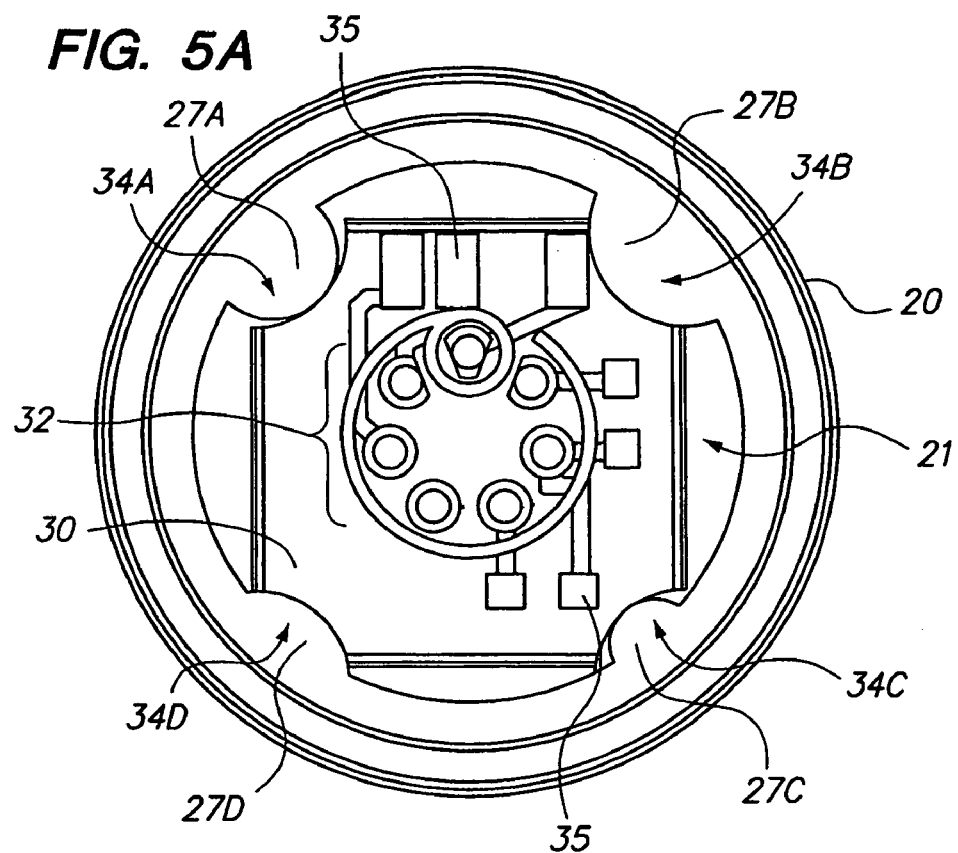
FIGS. 5A to 5G show various embodiments of the connector assembly illustrating the housing with the circuit block received therein.
Figure 5B:
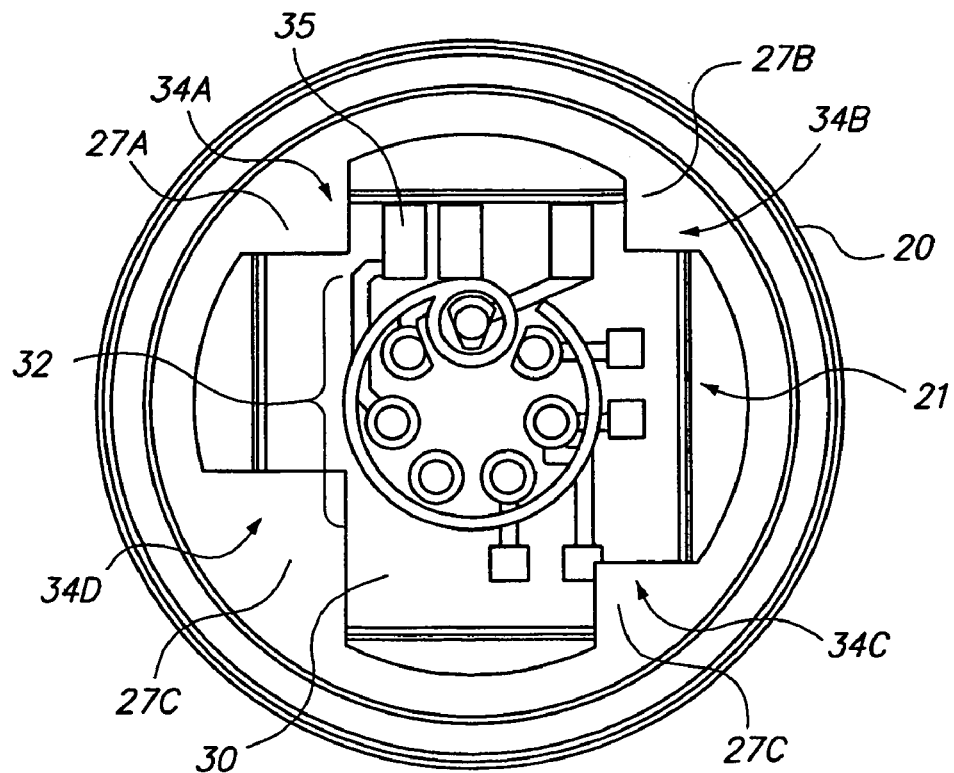
Figure 5C:
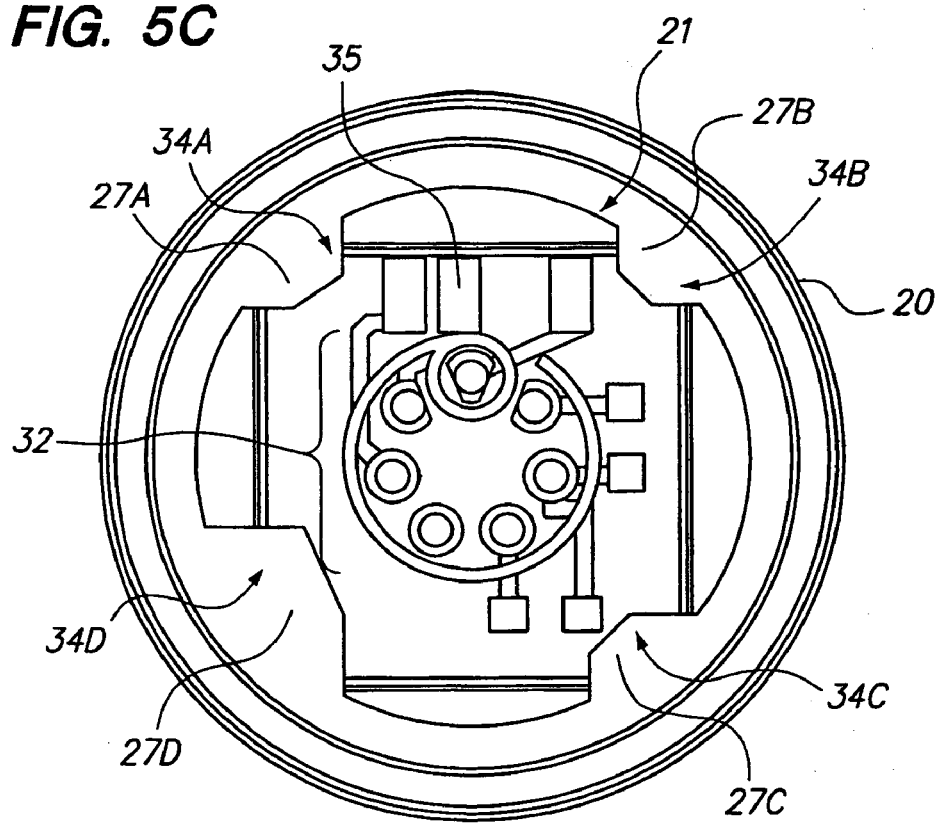
Figure 5D:
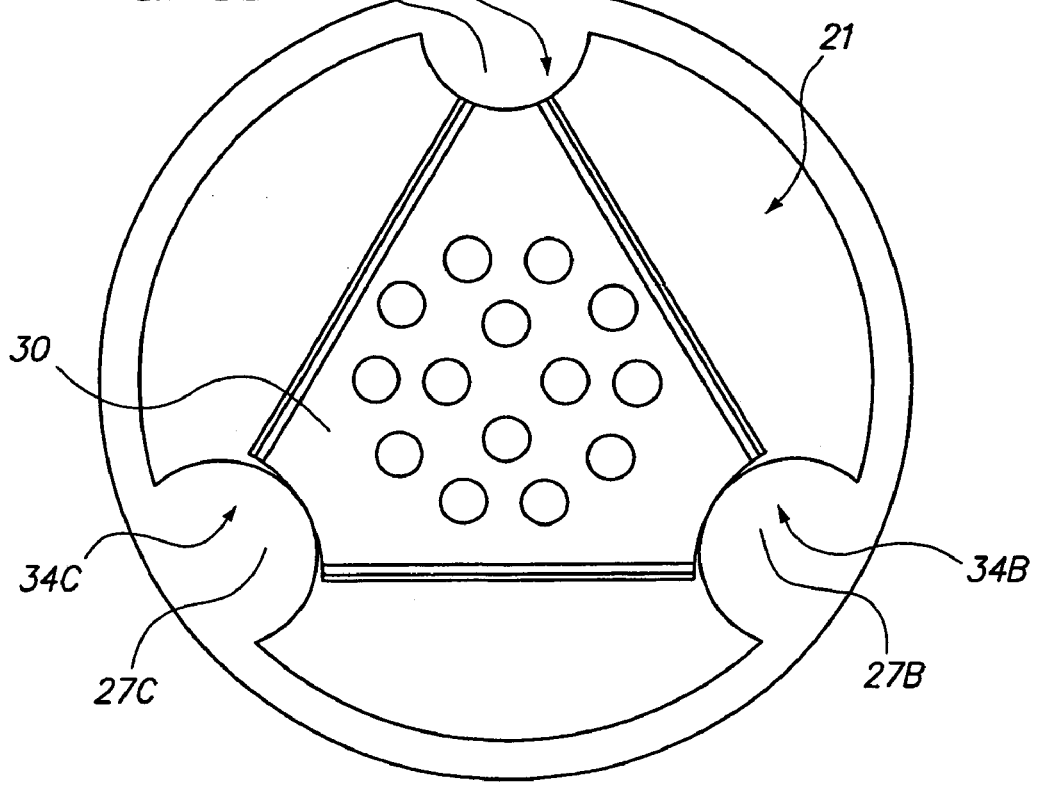
Figure 5E:
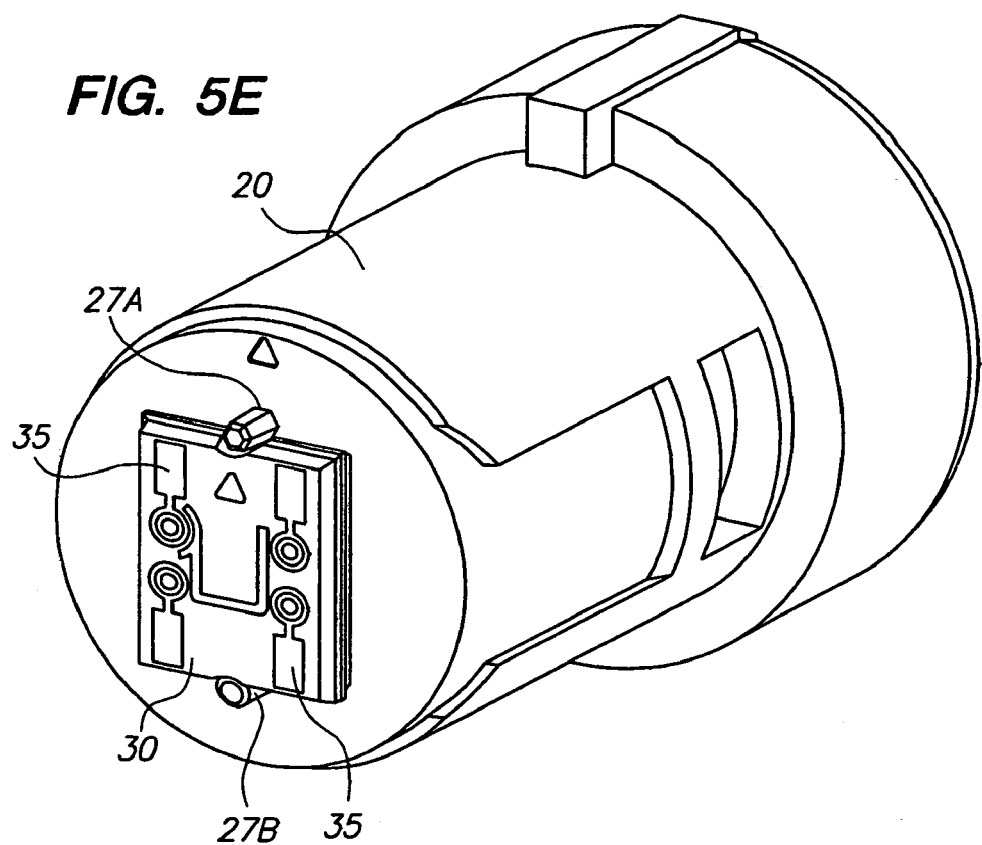
Figure 5F:
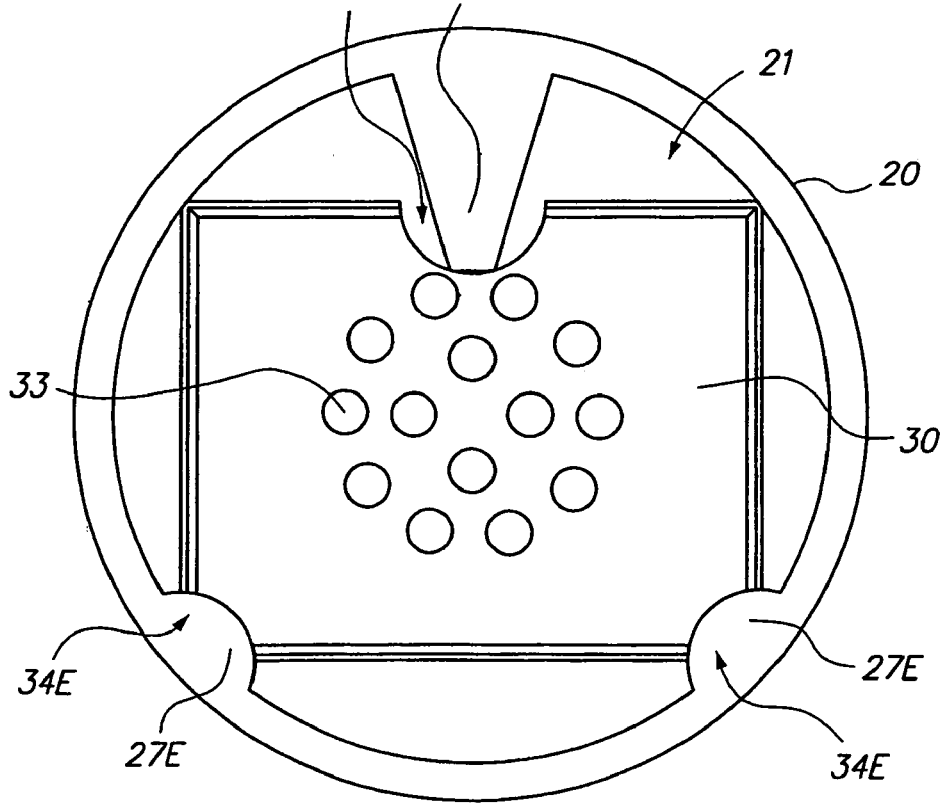
Figure 5G:
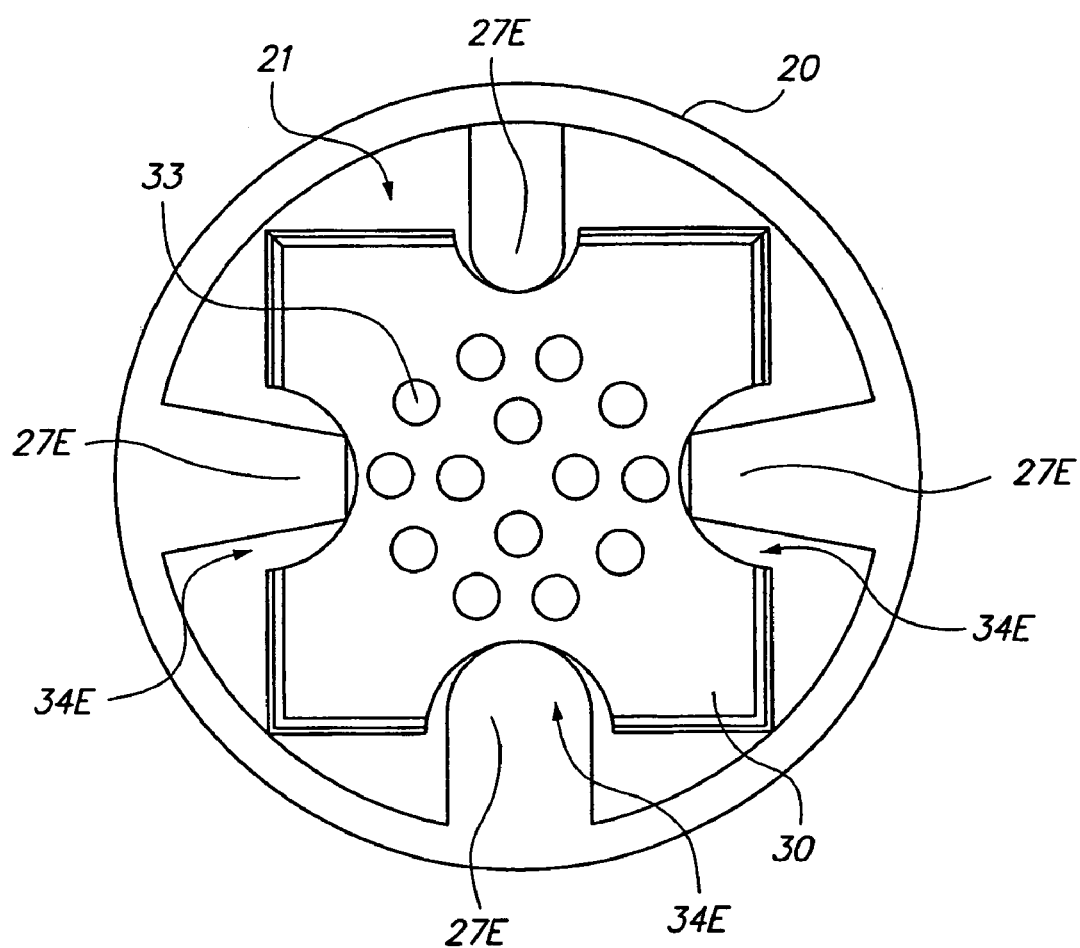

As also shown in each of FIGS. 5A to 5D, 5F and 5G, the shape of circuit block 30 itself may be the alignment feature of the circuit block. For example, as shown in each of FIGS. 5A to 5C, block 30 may be formed from a generally rectangular block of material, but with its four corner sections removed. Similarly, as shown in FIG. 5D, circuit block 30 may be formed from a generally triangular block of material, with its three corner sections removed. As shown in FIGS. 5F and 5G, non-corner sections of a rectangular block may be removed instead.

In preferred embodiments, block 30 is shaped such that it only fits in one orientation within recess 21 against outer wall 22 of housing 20. The present invention is not limited to any particular shape for block 30 (or any particular shape for optional corresponding recess 21). Rather, the present invention provides a system in which circuit block 30 and housing 20 are dimensioned to fit together in only one orientation.

In preferred embodiments, circuit block 30 is formed such that its shape is not symmetrical about either of two perpendicular axes disposed on a top surface of the block. This feature is shown in FIGS. 5A to 5D, 5F and 5G, wherein block 30 is not symmetrical about either one of any two perpendicular axes disposed in the plane of the page.

As shown in FIGS. 5A to 5D, block 30 has corner sections 34A, 34B, 34C and 34D removed. Recess 21 in housing 20 is provided with protrusions (or other elements) 27A, 27B, 27C and 27D that are dimensioned to be received within the removed corner sections 34A, 34B, 34C and 34D, respectively, of circuit block 30 (when circuit block 30 is received into recess 21 against outer wall 22 of housing 20).

FIGS. 5A to 5D show various geometries of protrusions 27A, 27B, 27C, and 27D; and removed corner sections 34A, 34B, 34C and 34D. It is to be understood the present invention is not limited to any particular geometries of these elements, and that the embodiments illustrated herein are merely exemplary.

As shown in FIGS. 5A and 5D, the edges of removed corner sections 34 may be rounded. As shown in FIGS. 5B and 5C, the edges of removed corner sections 34 may be rectangular. As shown in FIGS. 5A to 5D, the four corner sections 34 may not be of equal dimensions. In those optional embodiments of the invention where removed sections of circuit block: 30 are of equal size, their placement around block 30 is preferably non-symmetrical.

Referring to the optional embodiment of FIG. 5A, protrusions 27A, 27B, 27C, and 27D include two protrusions 34A and 34C that are tangent to block 30, and two protrusions 34B and 34D that are concentric to block 30. An advantage of this design is that it aids in improving the mechanical tolerances for the alignment of block 30 into housing 20 such that when either of the two concentric protrusions 27B and 27D are at opposing tolerance variations, they will cancel each other and center the block 30 between them. This may be referred to as the "root mean square" tolerance advantage. In accordance with the present invention, manufacturing misalignments and differences are thereby mitigated by averaging the sum of their variations. This advantageously reduces the number of variables and allows specific alignment features to "overcome" or "control" others.

Another advantage is that, with the varying sizes of holes 34, the useable surface area of the block 30 can be maximized. Thus, a greater amount of surface area of block 30 can be provided within recess 21 than would be the case if holes 34 were instead of the same size. This provides for an innovative solution to the classical problem of "Squaring the Circle" in a manufacturing environment which has challenged such notable thinkers as Leonardo Da Vinci, Archimedes, Hippocrates and Bernoulli. Specifically, using the present invention, the present inventors have fabricated twenty five blocks 30 in the same space that had normally been required for nine blocks 30. Furthermore, the present invention ensures that block 30 mates with housing 20 in only one possible orientation.

As shown in FIGS. 5F and 5G, block 30 may have non-corner sections 34E removed. Protrusions 27E on housing 20 mates with removed non-corner sections 34, in a manner similar to that explained above. FIGS. 5F and 5G also show an embodiment of the present invention in which there is no intelligent circuit (e.g.: circuit 32 in FIGS. 5A to 5E) formed on block 30. Instead, block 30 is simply formed with holes 33 passing therethrough. As explained above, contact pins 40 can be inserted through holes 33 when connector assembly 10 is assembled.

Thus, it is to be understood that the present invention incorporates embodiments of block 30 wherein block 30 is fabricated: (a) simply with holes 33 passing therethrough, (b) with holes 33 passing therethrough and with trace elements and/or hot bar pads 35 thereon, (c) with holes 33 passing therethrough and with passive components (e.g.: 64) thereon, and (d) with holes 33 passing therethrough and with intelligent logic circuit components (e.g.: 64) mounted thereon. Furthermore, in each of these various embodiments in which holes 33 pass through block 30, vias and/or ground plates may also be incorporated into block 30.

The present invention also provides a method of manufacturing an intelligent connector assembly 10 for use in an electrical interface between an electrical device (not shown) and an electrical cable 52, by: forming a circuit block 30 with a circuit 32 thereon and a plurality of contact pins 40 extending from a side, with contact pins 40 being in electrical communication with circuit 32; and placing circuit block 30 into housing 20 that is configured to be connected to electrical cable 52, wherein circuit block 30 and housing 20 have alignment features thereon such that circuit block 30 is receivable into housing 20 in only one orientation.

The present invention also provides a method for fabricating circuit blocks 30 in which a plurality of circuit blocks can be simultaneously fabricated, with each one being identically shaped, and with each having a shape that is receivable into housing 20 in only one orientation.

Referring first to FIG. 6A, a single sheet of material 80 is provided. A plurality of circuits 32 are fabricated onto single sheet 80. Sheet 80 may be a printed circuit board, but is not so limited. Instead, sheet 80 may be made of plastic, or any other material onto which circuits 32 may be fabricated.

After circuits 32 are fabricated onto single sheet 80, sheet 80 is separated into individual sections 30 (each of which was described herein as circuit block 30). Prior to separating single sheet 80 into individual circuit block sections 30, a repeating pattern of holes 82 is cut across sheet 80. Holes 82 may be drilled (such that they are circular), or they may be stamped, or they may be routed, stamped, milled, or fabricated in any other desirable way (such that they may be circular or any other shape).

As seen in FIG. 6A, holes 82 may be cut into single sheet 80 such that their centers 81 are disposed at the intersecting edges 38A and 38B of the individual rectangular circuit block sections 30.

In the embodiment shown in FIG. 6B, holes 82 are instead cut into single sheet 80 such that their centers 81 are disposed at one of the intersecting edges 38A of the individual circuit blocks 30, but offset from the other of the intersecting edges 38B of the individual circuit blocks 30.

Figure 6C:
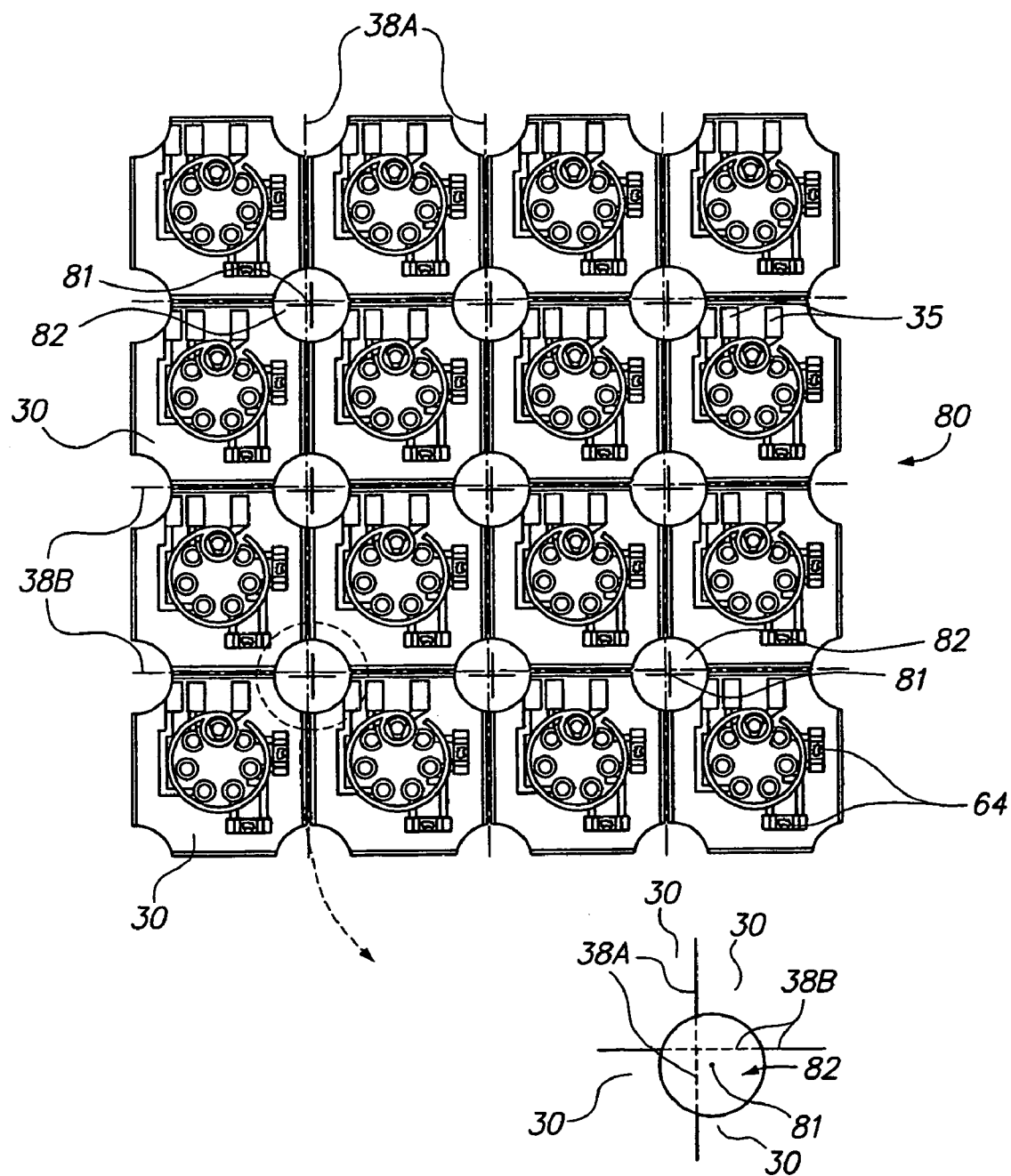

In the embodiment shown in FIG. 6C, holes 82 are instead cut into single sheet 80 such that their centers 81 are disposed offset from both of the intersecting edges 38A and 38B of the individual circuit blocks 30. This allows for four unique corner sections 34 for each circuit block 30 using only one drilled hole size 82.

Figure 6D:
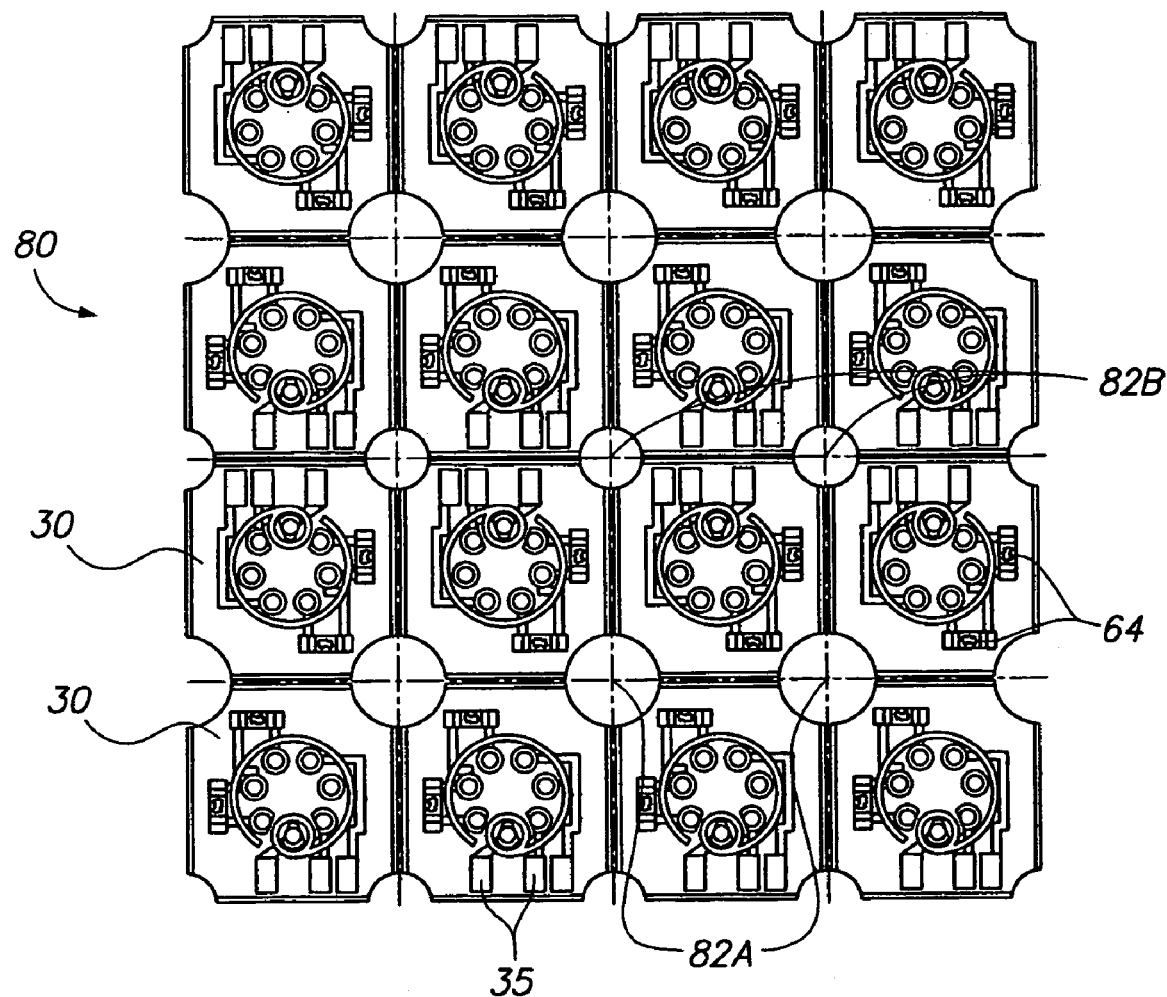

In the embodiment of FIG. 6D, holes 82A are one size, and holes 82B are another. Each of holes 82A and 82B are shown centered at the intersecting edges 38A and 38B of individual circuit blocks 30 (but need not be so disposed).

A particular advantage of the embodiment of the invention shown in FIG. 6D (as compared to that of FIGS. 6A to 6C) is that the embodiment of FIG. 6D provides a circuit block 30 having a longer linear edge therearound while still fitting within the same sized recess 21 in housing 20. Maximizing the length of the linear edge allows for more components to be added in the space, allows for termination options such as solder or hot bar pads 35, gives more room for running traces, and makes visual identification of alignment easier.

Figure 6E:
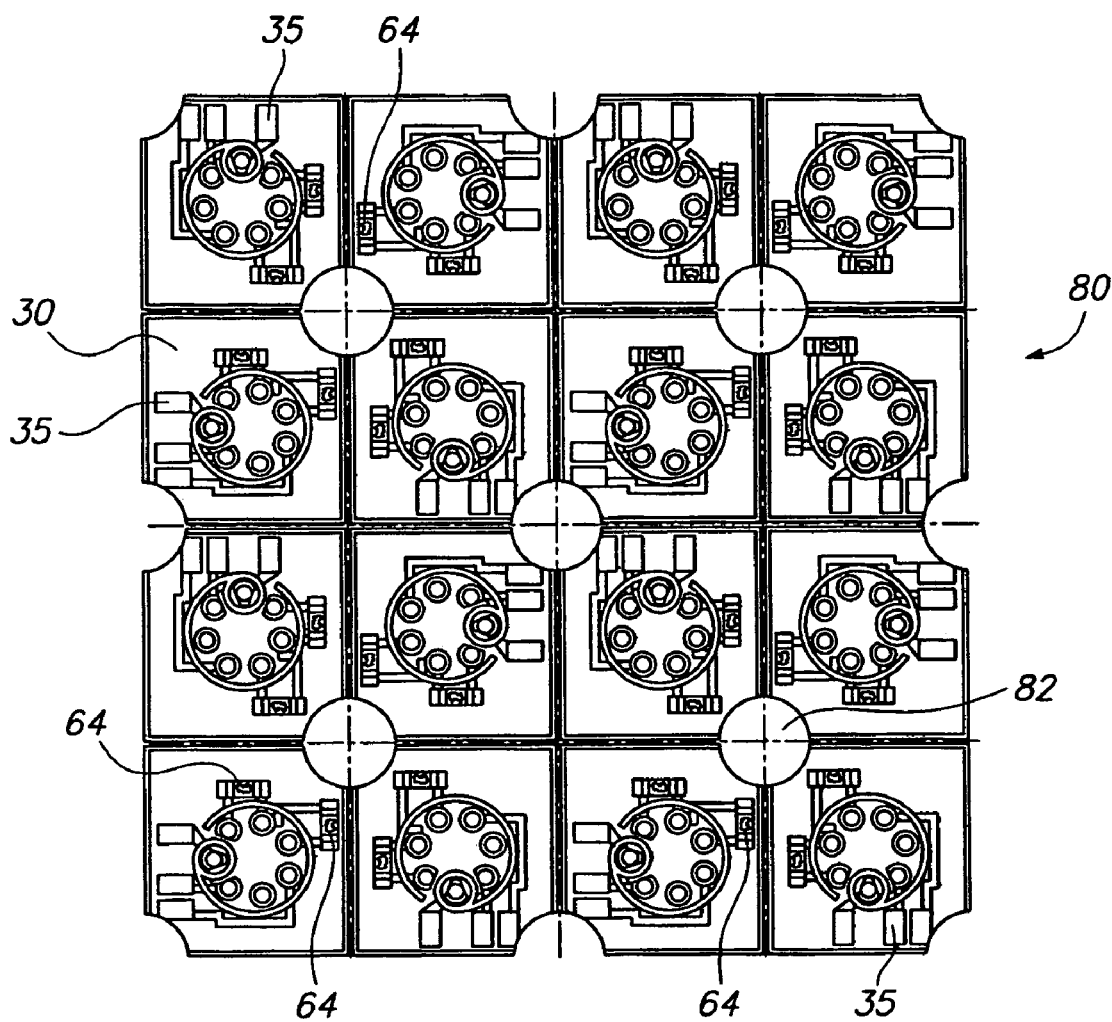

FIG. 6E shows an embodiment of the invention using fewer holes 82 than that of FIGS. 6A to 6D. Preferably holes 82 are offset from intersecting edges 38A and 38B of individual circuit blocks 30 or such that holes 82 are of differing sizes, such that the individual blocks 30 so formed can only be received into housing 20 in one orientation.

As shown in FIG. 6F, individual blocks 30 may also be formed from sheet 80 in hexagonal shapes by having the intersecting edges 38C and 38D of the blocks at a non-perpendicular angle to one another. In the illustrated embodiment, holes 82 are formed as a repeating pattern of holes of three different sizes. An advantage of the design shown in FIG. 6F is that its individual blocks 30 are well dimensioned to fit within the generally circular shape of recess 21 in housing 20. Thus, they provide a large surface area when received in a circular shaped recess 21. In addition, FIG. 6F illustrates an embodiment of the invention in which no components (e.g.: 64 in FIGS. 6A to 6E) or hot bar pads (e.g.: 35 in FIGS. 6A to 6E) are mounted onto blocks 30.

In accordance with the present invention, sheet 80 is separated into sections 30 such that each individual circuit 32 is disposed on an identically shaped section 30 of sheet 80. The separation of sheet 80 into sections 30 may be accomplished in a variety of different ways. For example, sheet 80 may be partially sawed into along both the top and bottom of the block along the intersecting edges 38A and 38B (or 38C and 38D) between individual sections 30. However, any system of reducing the thickness of sheet 80 along the intersecting edges 38A and 38B (or 38C and 38D) of the individual circuit blocks 30 may be used. Such system may be used to reduce the thickness of sheet 80 (between sections 30) by removing material from the top, the bottom, or both of sheet 80.

After the intersecting edges 38A and 38B (or 38C and 38D) between individual circuit blocks 30 have been weakened (by reducing their thickness) the individual circuit blocks 30 may, be separated from one another, simply by bending or twisting sheet 80. The individual circuit blocks 30 will then break off of sheet 80. This is typically done after all block 30's have been loaded with pins 40 and any other components 64, thereby making for completed circuit blocks 30 when broken from sheet 80.

After the individual circuit blocks 30 have been fabricated, they are each ready for insertion into a housing 20, with the shape of housing 20 and contact pins 40 providing a system with enhanced alignment and stability, as explained above.

Referring to FIG. 7, another optional embodiment of the invention is shown. In this embodiment, a second circuit block 30B is mounted on top of a first circuit block 30A. In various embodiments, some of contact pins 40 may pass through (or into) both of the circuit blocks 30A and 30B.

Thus, the same contact pins that are used to provide stability and alignment in the above described design can also be used to attach the second circuit block 30B to housing 20 of connector assembly 10. First circuit block 30A may have a first circuit 32A thereon, while second circuit block 30B may have a second circuit 32B thereon.

Various electrical components and contacts (including both passive and active logic components, collectively shown as components 64) may be mounted onto circuit 32 on block 30A or 30B, or both. Such electrical components may comprise, but are not limited to, wires, flex circuits, resistors, capacitors, inductors, valves, solenoids, switches, and light emitting diodes.

A first advantage of this stacked double circuit block design is that it provides additional space for mounting various electrical components to the circuits (32A and 32B) of the connector assembly 10. This also allows for an increased and controlled dielectric strength between contacts 40 and wire receiving clips 49. This increased dielectric strength also allows for traces to be run between a plurality of high voltage contacts 40 without the need for special insulators or additional isolation.

A second advantage of the stacked double circuit block design is that it reduces interference between the various electrical components that are mounted on each of the different circuit blocks 30A and 30B.

FIGS. 8A to 8F show optional embodiments of barbs 41 on contact pins 40 as they pass through the inner wall 24 of housing 20. FIGS. 8A to 8F are magnified views corresponding to the dotted line "FIG. 8" in FIG. 2. It is to be understood that the various embodiments of barbs 41 are merely exemplary and are not limiting. It is also to be understood that any of the optional embodiments of barbs 41 shown in FIGS. 8A to 8F may also be used on barbs 42 on contact pins 40 as they pass through circuit block 30.

Figure 8C:
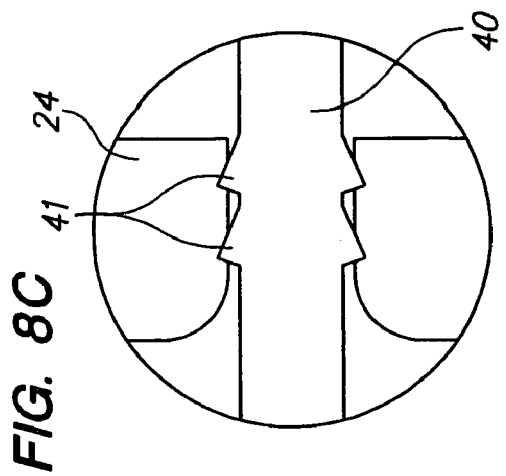
FIGS. 8A to 8F show various embodiments of barbs on contact pins passing through the inner wall of the housing.
Figure 8F:
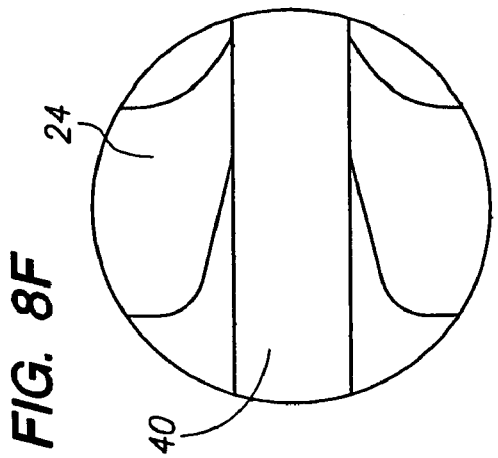
Figure 8B:
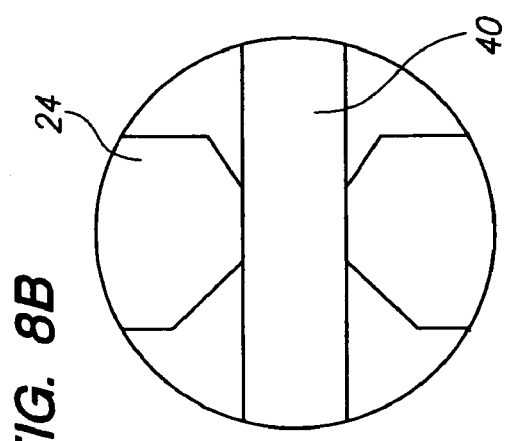
Figure 8E:
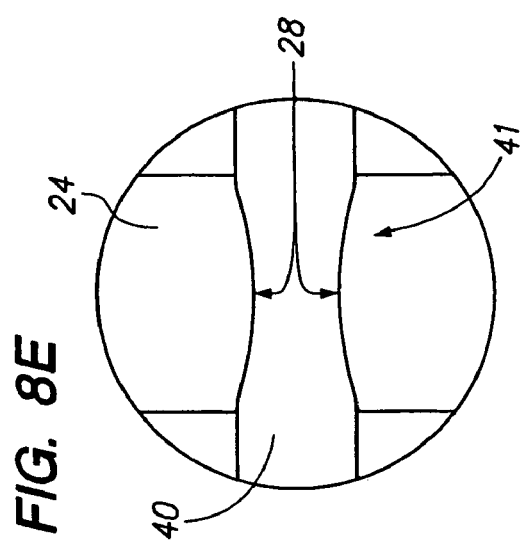
Figure 8A:
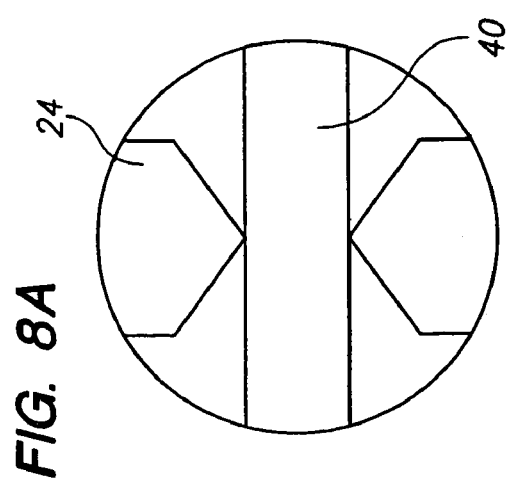

FIG. 8A and 8B show embodiments of the invention in which inner wall 24 is dimensioned to "pinch" against contact pin 40. The contacting surface area between pin 40 and inner wall 24 may be small (FIG. 8A) or somewhat larger (FIG. 8B).

FIG. 8C shows an embodiment of the invention in which a series of multiple barbs 41 are used on a single pin 40.

Figure 8D:
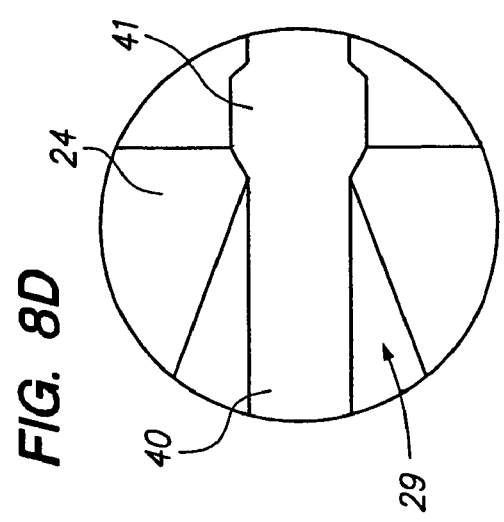

FIG. 8D shows an embodiment of the invention in which barb 41 is a large "bulge" on pin 40. Inner wall 24 has a funnel shaped opening 29 in which pin 40 is received. Thus, when "bulge" barb 41 is advanced through inner wall 24 to the position shown, pin 40 will then lock in position, such that it cannot easily be retracted. When combined with a matching barb 41 on the back of block 30 the pin 40 can be dimensioned so that it constantly places block 30 and housing 20 in dynamic tension with one another, thus aiding in the seal between housing 20 and pins 40.

FIG. 8E shows an embodiment of the invention in which pin 40 has a concave portion forming an inwardly shaped barb 41. Inner wall 24 has corresponding convex portions 28 that are received into inwardly shaped barb 41. It is to be understood that inner wall 24 may instead be concave with a matching convex barb 41.

FIG. 8F shows an embodiment of the invention in which inner wall 24 is plastically deformed when pin 40 passes therethrough.

Figure 9A:
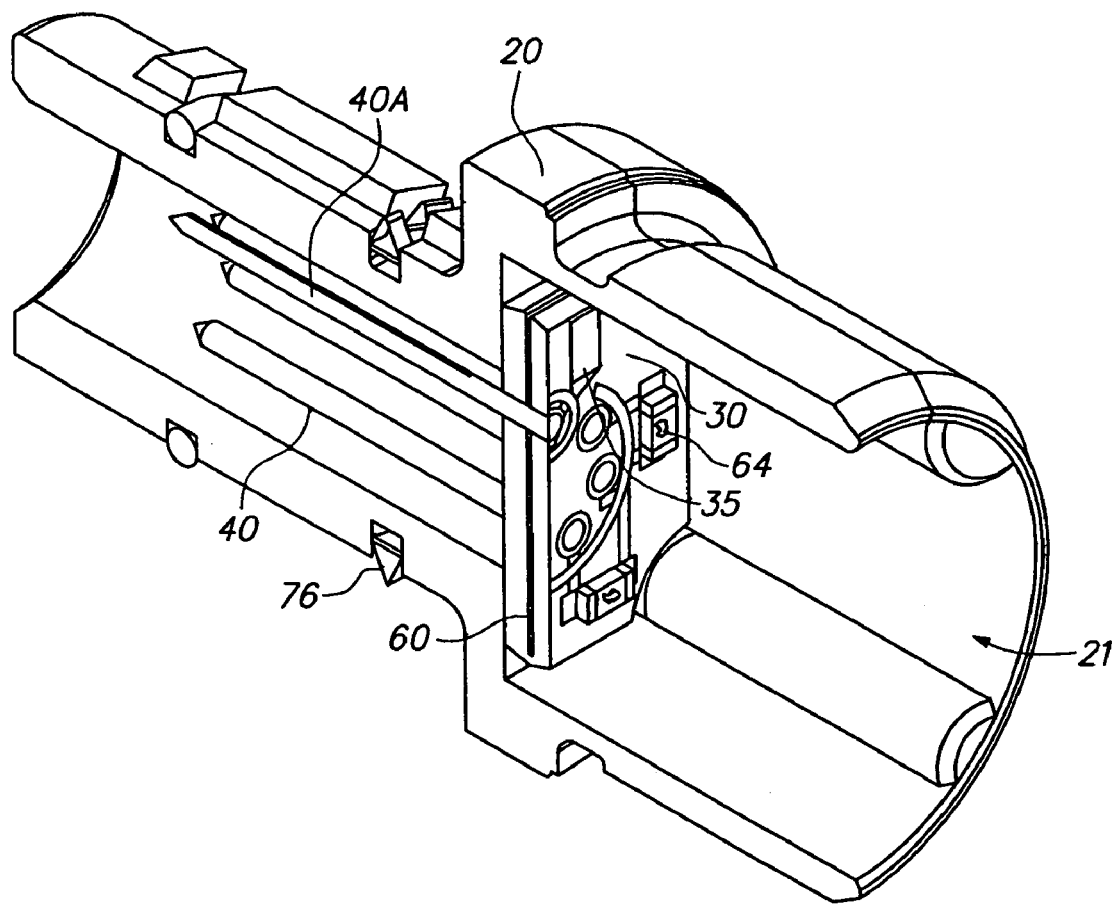
FIG. 9A is a sectional perspective view of an embodiment of the invention incorporating a ground plane into the circuit block.
Figure 9B:
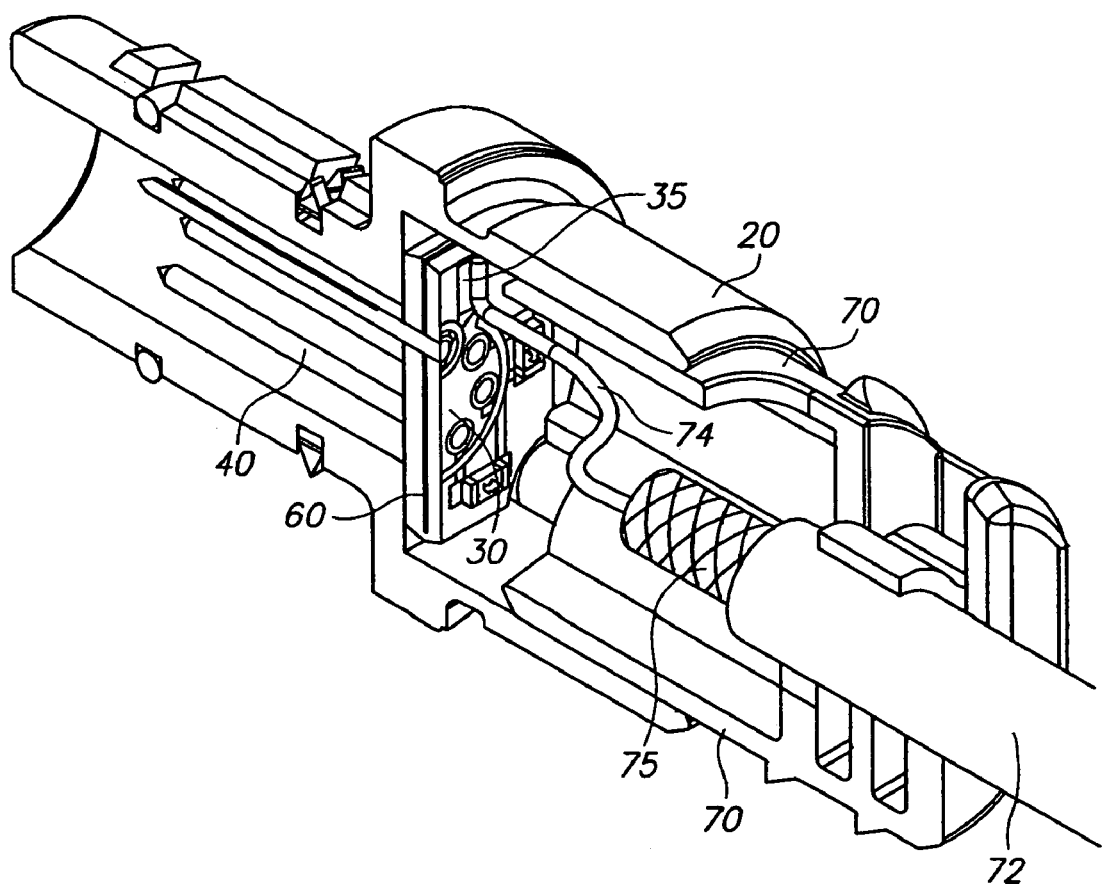
FIG. 9B is a view similar to FIG. 9A, incorporating an electrical cable and ground wire.

FIGS. 9A and 9B show an embodiment of the invention incorporating a ground plane into the circuit block, and an electrical cable having a ground wire. Specifically, block 30 incorporates a ground plane 60 therein. In this embodiment, housing 20 is preferably metallized to conduct electricity. Cable housing 70 is also preferably metallized to conduct electricity. Thus, when cable housing 70 is received into recess 21 in housing 20, housing 20 and cable housing 70 will conduct electricity therebetween. Cable housing 70 holds a cable 72 therein. Cable 72 includes a ground wire 74 (and a shield 75 therearound). Ground wire 74 is preferably connected to block 30 at solder pad 35. The ground path from ground wire 74 passes through block 30 and into a selected ground pin 40A. Ground pin 40A permits the present invention to transfer the ground from one electrical device into another. This is especially useful in that such ground is carried between housings 20 and 70 at the same time that electrical signals are transmitted between the device of FIGS. 9A and 9B and an electrical device (not shown) to which it is plugged into. For example, electrical signals may be transmitted through various non-grounded pins 40 while the ground is carried through pin 40A. Numerous embodiments for transferring the ground between electrical devices are contemplated within the scope of the present invention. In one embodiment, a contact band 76 on housing 20 is instead used to transmit the ground to another device (not shown) while non-grounded pins 40 transmit electrical signals thereto. In addition, ground plane 60 in block 30 may be used for transferring ground between various pins 40.

What is claimed:

1. A method of simultaneously fabricating a plurality of circuit blocks, wherein each circuit block is configured for aligned positioning onto a housing of an individual electrical connector, comprising:
   simultaneously fabricating a plurality of circuits in an X-Y grid on a single sheet of material;
   cutting a repeating pattern of holes across the single sheet of material such that identically shaped sections are formed around each of the plurality of circuits, with each section having one or more peripheral edges such that at least one hole is associated with each of the peripheral edges, with the holes being substantially evenly spaced around the periphery of each section, with at least two sections being defined in the X direction of the grid and at least two sections being defined in the Y direction of the grid; and
   separating the single sheet into sections, each section comprising a circuit block, wherein each of the sections is shaped to be receivable in only one orientation into the housing of the electrical connector.

2. The method of claim 1, wherein each of the identically shaped sections are not symmetrical about either of two perpendicular axes disposed on a top surface of each circuit block.

3. The method of claim 1, wherein each circuit block is a printed circuit board.

4. The method of claim 1, wherein each circuit block is plastic.

5. The method of claim 1, wherein cutting a repeating pattern of holes comprises:
   cutting holes at intersecting edges of the sections of the single sheet such that holes are associated with at least each corner of the peripheral edges of each section, wherein the holes are one of the same size or different sizes.

6. The method of claim 5, wherein the holes are drilled.

7. The method of claim 5, wherein the holes are stamped.

8. The method of claim 5, wherein the holes are routed.

9. The method of claim 5, wherein the holes are milled.

10. The method of claim 5, wherein each section is generally polygonal in shape.

11. The method of claim 10, wherein each of the sections is generally rectangular in shape.

12. The method of claim 10, wherein each of the sections is generally triangular in shape.

13. The method of claim 10, wherein each of the sections is generally circular in shape.

14. The method of claim 5, wherein the holes are circular and have centers that are disposed at the corners of the sections.

15. The method of claim 14, further comprising another hole formed at one or more peripheral edges of the section.

16. The method of claim 5, wherein the holes are circular and have centers that are disposed offset from the corners of the sections.

17. The method of claim 16, wherein the centers of the holes are disposed at the edge between two adjacent sections of the single sheet.

18. The method of claim 1, further comprising:
reducing the thickness of the single sheet along the peripheral edges of the sections prior to separating the sections from one another.

19. The method of claim 18, wherein reducing the thickness of the single sheet comprises:
removing material from opposing sides of the sheet using a cutting device.

20. The method of claim 1, further comprising:
mounting electrical contacts to the sections, the electrical contacts being in electrical communication with the circuits on the sections.

21. The method of claim 20, further comprising:
mounting electrical components to the circuits on the individual sections.

22. The method of claim 1, further comprising:
mounting each of the sections in a separate connector assembly housing.

23. The method of claim 1, wherein the holes are non circular in shape.

24. A method of simultaneously fabricating a plurality of substantially identical circuit blocks, wherein each circuit block is configured for aligned positioning in a single orientation into an electrical connector, comprising:
providing a sheet of material for use as a base for a plurality of circuit blocks defined in an X-Y grid having at least two circuit blocks in the X-direction and at least two circuit blocks in the Y-direction;
cutting a repeating pattern of holes across the sheet of material such that at least some of the holes define an outer periphery for a plurality of substantially identical circuit blocks, wherein the outer periphery includes one or more peripheral edges, each of which is associated with one or more of the holes; and
separating the sheet into sections such that at least two adjacent peripheral edges of each circuit block are separated and each section comprises a substantially identical individual circuit block, wherein the outer periphery of each circuit block has an outer peripheral shape such that each circuit block is positionable in an electrical connector in a single orientation.

25. The method of claim 24, wherein the sheet of material is one of a printed circuit board or a plastic material.

26. The method of claim 24, wherein the cutting step includes cutting the holes via at least one of drilling, stamping, routing, or milling.

27. The method of claim 24, wherein the holes are one of round, arcuate, or polygonal.

28. The method of claim 24, further comprising mounting circuits and electrical contacts on the sheet of material such that each section includes a single circuit with associated electrical contacts.

* * * * *